(12) United States Patent
Kim

(10) Patent No.: US 8,013,447 B2
(45) Date of Patent: Sep. 6, 2011

(54) SEMICONDUCTOR DEVICE AND METHOD FOR FABRICATING THE SAME

(75) Inventor: Young Seok Kim, Bucheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/271,626

(22) Filed: Nov. 14, 2008

(65) Prior Publication Data

US 2009/0072354 A1    Mar. 19, 2009

Related U.S. Application Data

(62) Division of application No. 11/481,199, filed on Jul. 3, 2006, now abandoned.

(30) Foreign Application Priority Data

Jul. 20, 2005    (KR) .................. 10-2005-0065784

(51) Int. Cl.
*H01L 21/28*    (2006.01)
*H01L 29/41*    (2006.01)

(52) U.S. Cl. . 257/758; 257/618; 257/620; 257/E29.112; 438/622; 438/666

(58) Field of Classification Search ............ 257/618, 257/620, E29.112, 758; 438/622, 666
See application file for complete search history.

(56) References Cited

U.S. PATENT DOCUMENTS

| 5,270,256 | A | * | 12/1993 | Bost et al. | 438/453 |
| 5,674,787 | A | | 10/1997 | Zhao et al. | |
| 5,834,829 | A | * | 11/1998 | Dinkel et al. | 257/620 |
| 6,022,791 | A | * | 2/2000 | Cook et al. | 438/458 |
| 6,163,065 | A | * | 12/2000 | Seshan et al. | 257/620 |
| 6,365,958 | B1 | * | 4/2002 | Ibnabdeljalil et al. | 257/620 |
| 6,495,918 | B1 | * | 12/2002 | Brintzinger | 257/758 |
| 2003/0218254 | A1 | * | 11/2003 | Kurimoto et al. | 257/758 |
| 2004/0217477 | A1 | * | 11/2004 | Tsai et al. | 257/758 |
| 2005/0098893 | A1 | * | 5/2005 | Tsutsue et al. | 257/758 |

FOREIGN PATENT DOCUMENTS

| JP | 7201855 | | 8/1995 |
| JP | 2000269219 | A * | 9/2000 |
| KR | 1998-055962 | | 9/1998 |
| KR | 1020000076899 | | 12/2000 |

* cited by examiner

*Primary Examiner* — Eugene Lee
*Assistant Examiner* — Peniel M Gumedzoe
(74) *Attorney, Agent, or Firm* — Kilpatrick Townsend & Stockton LLP

(57) ABSTRACT

The semiconductor device includes an upper electrode line structure and a lower electrode line structure provided over a semiconductor substrate. The semiconductor device also includes a guard contact having a first portion and a second portion. The guard contact is disposed between the upper electrode line structure and the lower electrode line structure. The first and second portions of the guard contact have different line widths.

7 Claims, 5 Drawing Sheets

<Prior Art>

SEMICONDUCTOR DEVICE AND METHOD FOR FABRICATING THE SAME

CROSS-REFERENCES TO RELATED APPLICATIONS

The present application claims priority to Korean patent application number 10-2005-0065784, filed on Jul. 20, 2005, which is incorporated by reference in its entirety.

BACKGROUND OF THE INVENTION

The present invention relates to a semiconductor memory device. More particularly, the present invention relates to a method for fabricating a memory device wherein a guard contact formed in a chip guard is strengthened to prevent cracking caused from outside stresses.

FIG. 1 is a layout view illustrating a conventional semiconductor device. FIG. 2 is a simplified cross-sectional view taken along line I-I' of FIG. 1.

Referring to FIGS. 1 and 2, a lower electrode line structure 30 and an upper electrode line structure 50 are disposed over a semiconductor substrate (not shown) having a lower structure including a gate, a bit line, and a bit line contact. A guard contact 40 is disposed between the lower electrode line structure 30 and the upper electrode line structure 50. Here, the guard contact 40 is formed of a whole body-type contact vertical to the lower electrode line structure 30. The guard contact 40 is formed to prevent impurity particles from passing.

FIG. 3 is a simplified cross-sectional view illustrating a conventional semiconductor device. In particular, it shows the failure of a fuse guard structure caused by the outside stresses.

Referring to FIG. 3, a gate 5 and a bit line 20 is formed over a semiconductor substrate (not shown), and a bit line contact 15 is formed to connect the bit line 20 to the gate 5. A lower electrode line structure 30 is formed over the bit line 20, and a lower electrode contact 25 is formed to connect the lower electrode line structure 30 to the bit line 20. An upper electrode line structure 50 is formed over the lower electrode line structure 30, and a whole body-type guard contact 40 is formed to connect the upper electrode line structure 50 to the lower electrode line structure 30.

According to the above conventional semiconductor device, the guard contact cannot prevent a crack from occurring when a chip is cut due to shrinkage to a fuse of the device. As a result, a "cracking phenomenon" between the electrode line structures shown in FIG. 3 occurs due to the outside stress and pressures in other processes. This allows impurity particles to enter into the lower electrode line structure through the cracks. Accordingly, the yield and reliability of the device may be degraded.

BRIEF SUMMARY OF THE INVENTION

The present invention relates to a semiconductor device and a method for fabricating wherein a guard contact formed in a chip guard is designed with two portions with different line widths. The two portions provide a zigzag or criss-cross pattern to increase the strength of the structure, thereby preventing impurity particles from passing and increasing resistance against outside stresses. Accordingly, reliability and yield of the device can be improved.

According to an embodiment of the present invention, a semiconductor device having an upper electrode line structure and a lower electrode line structure over a semiconductor substrate includes: a guard contact having a first portion and a second portion with different line width, disposed between the upper electrode line structure and the lower electrode line structure, wherein the first portion is disposed parallel to the upper electrode line structure, and the second portion is disposed perpendicular to the upper electrode line structure.

According to another embodiment of the present invention, a method for fabricating a semiconductor device includes: (a) forming a lower electrode line structure over a semiconductor substrate having a lower structure; (b) forming a guard line having a first portion and a second portion over the lower electrode structure, wherein the line width of the first and second regions are different; and (c) forming an upper electrode line structure over the guard contact.

DESCRIPTION OF SPECIFIC EMBODIMENTS

Figure 1:
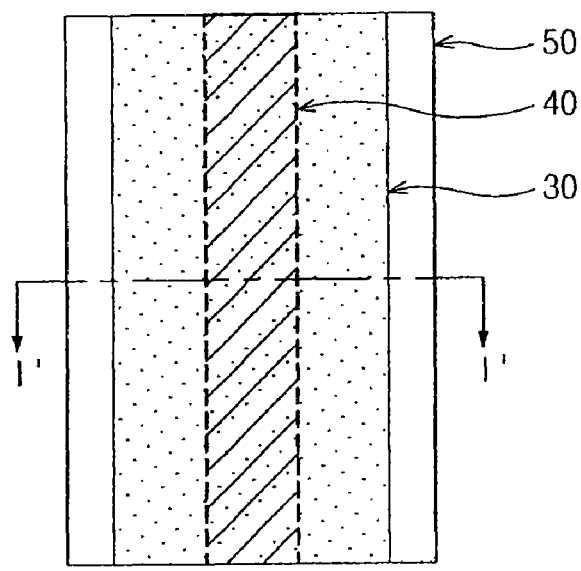
FIG. 1 is a simplified layout of a conventional semiconductor device.
Figure 2:
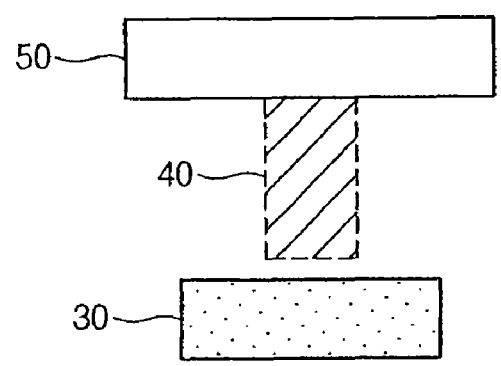
FIG. 2 is a simplified cross-sectional view illustrating a conventional semiconductor device.
Figure 3:
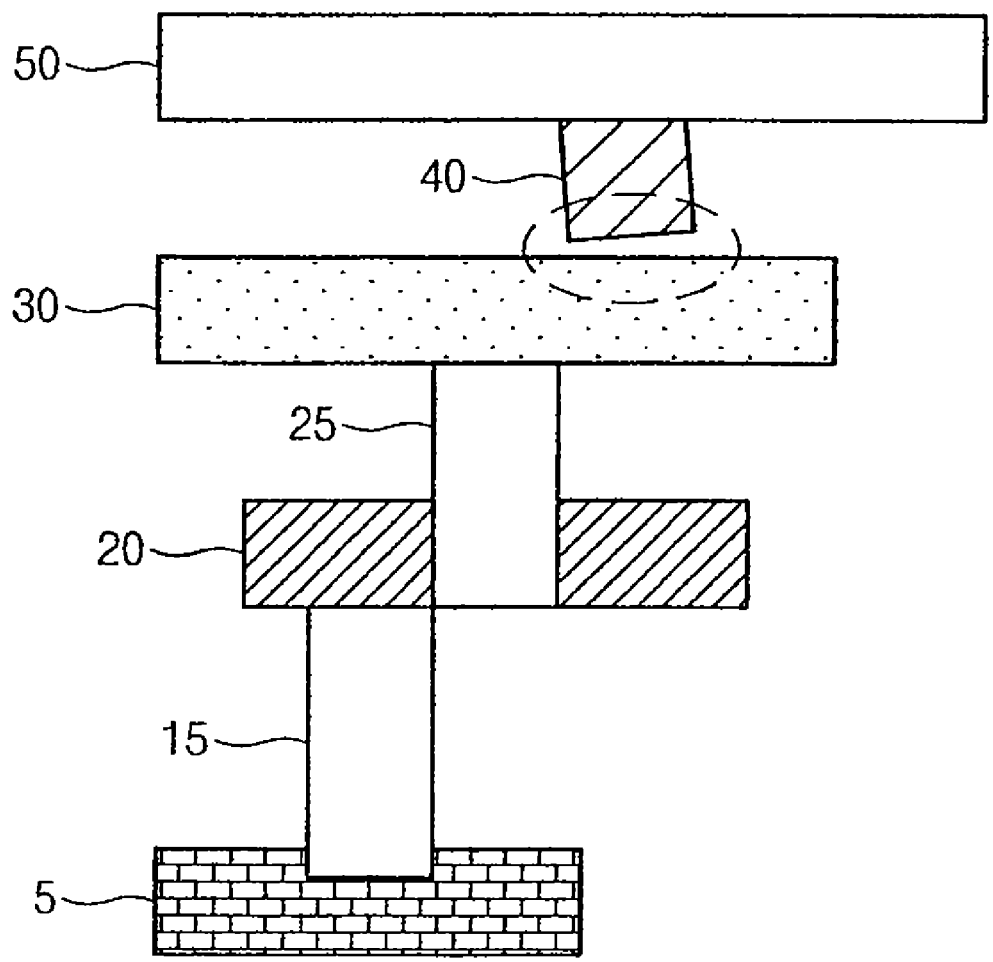
FIG. 3 is a simplified cross-sectional view illustrating a conventional semiconductor device.
Figure 4:
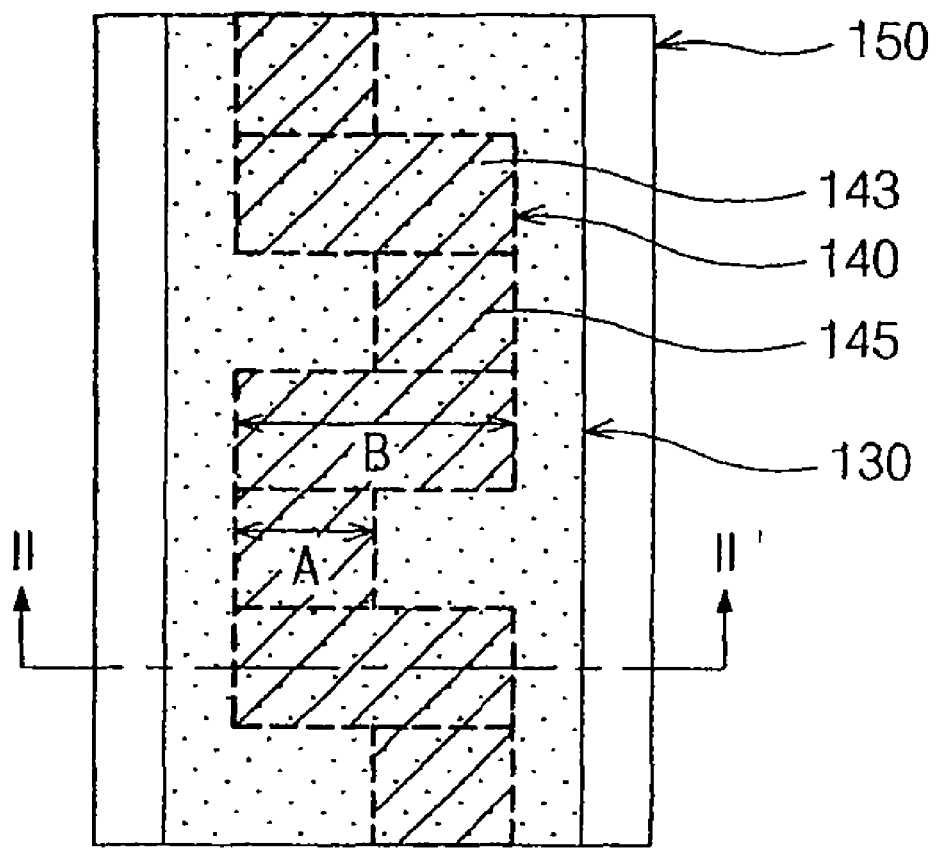
FIG. 4 is a simplified layout of a semiconductor device according to one embodiment of the present invention.

FIG. 4 is a simplified layout of a semiconductor device according to one embodiment of the present invention. A lower electrode line structure 130 and an upper electrode line structure 150 are manufactured parallel to each other over a semiconductor substrate (not shown) having a lower structure (not shown). A guard contact 140 having a first portion 145 and a second portion 143 with different line widths are disposed between the lower electrode line structure 130 and the upper electrode line structure 150.

In one embodiment of the present invention, the first portion 145 and the second portion 143 of the guard contact 140 are alternately disposed over the lower electrode line structure 130 in a zigzag pattern, as can be seen in FIG. 4a. In addition, the line width of the second portion 143 (B) is equal to or greater than that of the first portion 145 (A). In one implementation, the line width of the second portion 143 is at least twice that of the first portion 145, the width being the direction along the longitudinal extension of the lower electrode line structure 130.

Figure 5:
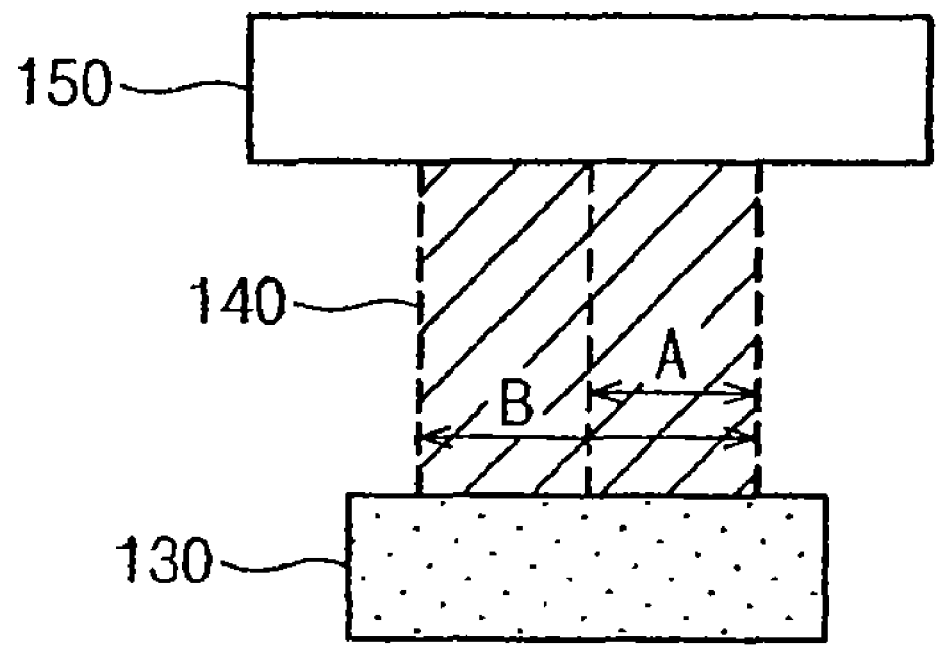
FIG. 5 is a simplified cross-sectional view illustrating a semiconductor device according to one embodiment of the present invention.

FIG. 5 is a simplified cross-sectional view taken along the line II-II' of FIG. 4. Reference symbols A and B denote the line width of the first portion 145 and that of the second portion 143, respectively. Since B is greater than A in the guard contact 140, the lower electrode line structure 130 can support the outside stress or pressure from other processes, thereby preventing cracking phenomenon for the guard contact. Thereafter, an upper electrode line structure 150 is formed over the guard contact 140.

Figure 6:
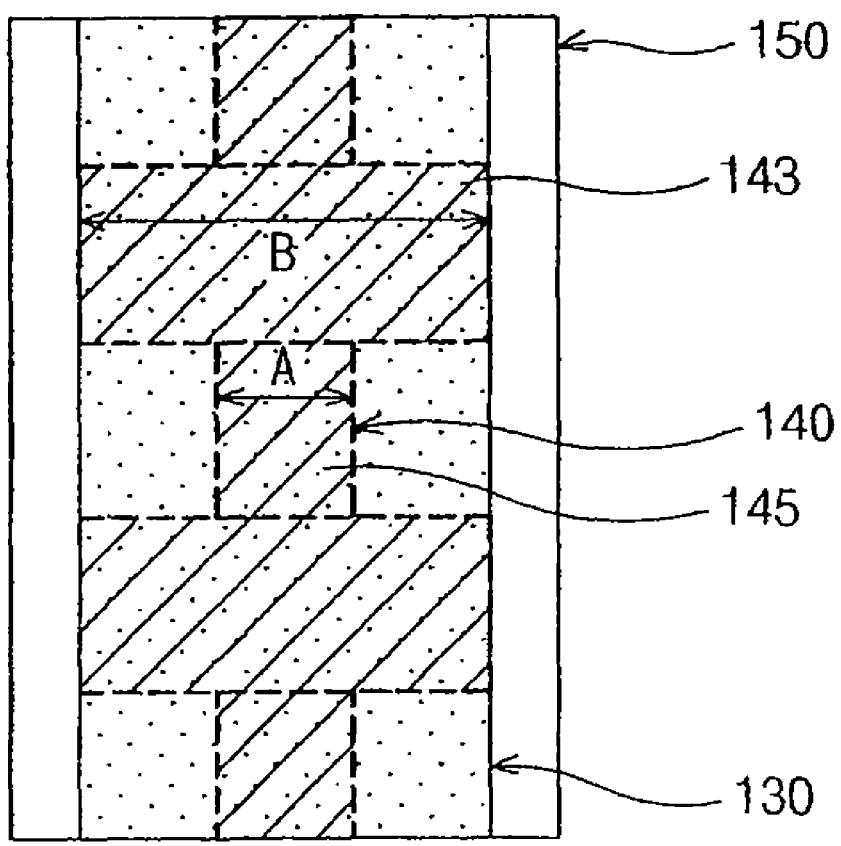
FIG. 6 is a simplified layout of a semiconductor device according to another embodiment of the present invention.

FIG. 6 is a simplified layout of a semiconductor device according to another embodiment of the present invention. A lower electrode line structure 130 and an upper electrode line structure 150 are manufactured parallel to each other over the semiconductor substrate (not shown). A guard contact 140 having a first portion 145 and a second portion 143 with different line widths is disposed between the lower electrode line structure 130 and the upper electrode line structure 150.

In another embodiment of the present invention, the first portion 145 and the second portion 143 of the guard contact 140 are alternately disposed over the lower electrode line structure 130, where the two portions (or regions) are centered over the lower electrode line structure 130, as can be seen in FIG. 6. The second portion 143 has substantially the same line width along a longitudinal direction of the lower electrode line structure 130. In addition, the line width of the second portion 143 (B) is greater than that of the first portion 145 (A).

According to one embodiment of the present invention, since the guard contact plays the role of a structural member for supporting the outside stresses or pressures, the electrode line structures are prevented from cracking and allowing impurity particles to enter the electrode line structures. Accordingly, the process yield and reliability of the device can be improved.

The description of various embodiments of the invention has been presented for purposes of illustration and description. It is not intended to be exhaustive or to limit the invention to the precise form disclosed, and modifications and variations are possible in light of the above teachings. The embodiments were chosen and described in order to explain the principles of the invention and its practical application to enable one skilled in the art to utilize the invention in various embodiments and with various modifications as are suited to the particular use.

What is claimed is:

1. A semiconductor device, comprising:
    an upper electrode line structure having a constant width and a lower electrode line structure having a constant width provided over a semiconductor substrate, wherein the width of the upper electrode line structure is greater than the width of the lower electrode line structure; and
    a guard contact having a plurality of first portions and a plurality of second portions that are alternately disposed in a single layer that is disposed between and in direct contact with the upper electrode line structure and the lower electrode line structure, the first and second portions of the guard contact having different line widths, wherein centerlines of the first portion and the second portion of the guard contact are disposed on a common straight line.

2. The semiconductor device according to claim 1, wherein a width of the first portion is at least double a width of the second portion.

3. A method for fabricating a semiconductor device, the method comprising:
    forming a lower electrode line structure having a constant width over a semiconductor substrate having a lower structure;
    forming a guard line having a plurality of first portions and a plurality of second portions that are alternatively disposed in a single layer over and in direct contact with the lower electrode line structure, wherein a line width of the first portions and a line width of the second portions are different, centerlines of the first portion and the second portion of the guard contact being disposed on a common straight line; and
    forming an upper electrode line structure having a constant width over the guard contact, wherein the width of the upper electrode line structure is greater than the width of the lower electrode line structure.

4. The method according to claim 3, wherein a width of the first portion is greater than a width of the second portion, the width being in a direction corresponding to a longitudinal direction of the lower electrode line structure.

5. The method according to claim 3, wherein a width of the first portion is at least double a width of the second portion.

6. The semiconductor device according to claim 1, wherein a width of the first portion is equal to or smaller than the width of the lower electrode line structure.

7. The method according to claim 3, wherein the upper electrode line structure directly contacts the guard line.

* * * * *